US012631977B2

(12) United States Patent
Hulsebos

(10) Patent No.: US 12,631,977 B2
(45) Date of Patent: May 19, 2026

(54) METHOD FOR DETERMINING AN ALIGNMENT MODEL BASED ON AN OBLIQUE FITTING TECHNIQUE

(71) Applicant: ASML Netherlands B.V., Veldhoven (NL)

(72) Inventor: Maria Edo Hulsebos, Bergeijk (NL)

(73) Assignee: ASML Netherlands B.V., Veldhoven (NL)

( * ) Notice: Subject to any disclaimer, the term of this patent is extended or adjusted under 35 U.S.C. 154(b) by 1046 days.

(21) Appl. No.: 17/608,750

(22) PCT Filed: Apr. 2, 2020

(86) PCT No.: PCT/EP2020/059411
§ 371 (c)(1),
(2) Date: Nov. 3, 2021

(87) PCT Pub. No.: WO2020/224879
PCT Pub. Date: Nov. 12, 2020

(65) Prior Publication Data
US 2022/0276575 A1    Sep. 1, 2022

(30) Foreign Application Priority Data

May 3, 2019   (EP) ..................................... 19172514

(51) Int. Cl.
*G03F 9/00*         (2006.01)
*G03F 7/00*         (2006.01)
(52) U.S. Cl.
CPC ........ *G03F 9/7046* (2013.01); *G03F 7/70633* (2013.01); *G03F 7/70641* (2013.01); *G03F 7/70683* (2013.01); *G03F 9/7076* (2013.01)
(58) Field of Classification Search
CPC ............. G03F 7/70633; G03F 7/70641; G03F 7/70683; G03F 9/7076; G03F 9/7046
(Continued)

(56) References Cited

U.S. PATENT DOCUMENTS 6,961,116 B2 * 11/2005 Den Boef .............. G03B 27/32
                                                          355/71
7,583,359 B2     9/2009  Moest
(Continued)

FOREIGN PATENT DOCUMENTS

EP            1744217 A1      1/2007
JP         2013-074294        4/2013
(Continued)

OTHER PUBLICATIONS

Zvonarev et al. ("Iterative algorithms for weighted and unweighted finite-rank time-series approximations." (2015) arXiv preprint arXiv:1507.02751). (Year: 2015).*
(Continued)

*Primary Examiner* — Michael P Nghiem
(74) *Attorney, Agent, or Firm* — FINNEGAN, HENDERSON, FARABOW, GARRETT & DUNNER, LLP

(57)            ABSTRACT

Described herein are methods of determining an alignment model associated with a mark layout. A method includes obtaining (a) first measurement data a relatively dense mark layout (e.g., more than 200 marks) in comparison with a relatively sparse mark layout (e.g., less than 65 marks) and a second measurement data associated with the relatively sparse mark layout, and (b) a first fitted model that describes object deformation for the relatively dense overlay mark layout; and determining the alignment model based on a second fitted model that describes object deformation for the relatively sparse mark layout, via an fitting technique, based on generalized squares fitting employing an oblique inner product matrix (e.g., W) or an oblique projection least squares fitting employing an oblique projection matrix (e.g., P).

12 Claims, 10 Drawing Sheets

(58) Field of Classification Search
USPC .......................................................... 702/150
See application file for complete search history.

(56)                         References Cited

U.S. PATENT DOCUMENTS

| | | | |
|---|---|---|---|
| 7,791,727 B2 * | 9/2010 | Den Boef .......... | G01N 21/8806 |
| | | | 356/521 |
| 2013/0230797 A1 * | 9/2013 | Van Der Sanden ......................... | |
| | | | G03F 7/70616 |
| | | | 430/30 |
| 2015/0261097 A1 * | 9/2015 | Mathijssen ......... | G03F 7/70141 |
| | | | 355/67 |
| 2016/0246185 A1 * | 8/2016 | Ypma .................. | G03F 7/70508 |
| 2017/0108783 A1 * | 4/2017 | Kramer ................. | G03F 9/7003 |
| 2017/0277045 A1 | 9/2017 | Menger et al. | |
| 2018/0314168 A1 | 11/2018 | Van Haren et al. | |
| 2019/0064680 A1 | 2/2019 | Schmitt-Weaver et al. | |
| 2019/0086201 A1 | 3/2019 | Den Boef et al. | |

FOREIGN PATENT DOCUMENTS

| | | |
|---|---|---|
| JP | 2017-524960 | 8/2017 |
| KR | 2017-0077214 A | 7/2017 |
| TW | 201843534 A | 12/2018 |
| WO | WO 2011/087129 | 7/2011 |
| WO | WO 2017/194289 A1 | 11/2017 |
| WO | WO 2018/153711 A1 | 8/2018 |
| WO | WO 2019/001871 A1 | 1/2019 |
| WO | WO 2019/149423 A1 | 8/2019 |

OTHER PUBLICATIONS

Antezana et al. ("Oblique Projections and Frames." Proceedings of the American Mathematical Society) (2006), 134(4), p. 1031-1037) (Year: 2006).*

Notification of Reason(s) for Refusal issued by the Japan Patent Office in related Japanese Patent Application No. 2021-564990; mailed Nov. 1, 2022 (8 pgs.).

International Search Report and Written Opinion issued by the International Searching Authority in related International Application No. PCT/EP2020/059411, mailed Jul. 27, 2020.

Office Action issued by the Intellectual Property Office (IPO) in related ROC (Taiwan) Patent Application No. 109113751, issued Mar. 19, 2021.

\* cited by examiner

801

810

METHOD FOR DETERMINING AN ALIGNMENT MODEL BASED ON AN OBLIQUE FITTING TECHNIQUE

CROSS-REFERENCE TO RELATED APPLICATION

The application claims priority to International Application No. PCT/EP2020/059411, filed Apr. 2, 2020, and published as WO 2020/224879 A1, which claims priority of EP application 19172514.2 which was filed on May 3, 2019. The contents of these applications are incorporated herein by reference in their entireties.

FIELD

Present description relates to inspection apparatus and methods usable, for example, to perform metrology in the manufacture of devices by lithographic techniques or controlling the lithographic apparatus during a patterning process. The description yet further relates to computer program products for use in implementing such methods.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern (also often referred to as "design layout" or "design") of a patterning device (e.g., a mask) onto a layer of radiation-sensitive material (resist) provided on a substrate (e.g., a wafer).

As semiconductor manufacturing processes continue to advance, the dimensions of circuit elements have continually been reduced while the amount of functional elements, such as transistors, per device has been steadily increasing over decades, following a trend commonly referred to as 'Moore's law'. To keep up with Moore's law the semiconductor industry is chasing technologies that enable to create increasingly smaller features. To project a pattern on a substrate a lithographic apparatus may use electromagnetic radiation. The wavelength of this radiation determines the minimum size of features which are patterned on the substrate. Typical wavelengths currently in use are 365 nm (i-line), 248 nm, 193 nm and 13.5 nm. A lithographic apparatus, which uses extreme ultraviolet (EUV) radiation, having a wavelength within a range of 4 nm to 20 nm, for example 6.7 nm or 13.5 nm, may be used to form smaller features on a substrate than a lithographic apparatus which uses, for example, radiation with a wavelength of 193 nm.

In an example lithographic apparatus, a patterning device, which is alternatively referred to as a mask or a reticle, may be used to generate a circuit pattern to be formed on an individual layer of the IC. This pattern can be transferred onto a target portion (e.g., including part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. These target portions are commonly referred to as "fields". Wafers are processed in batches or lots through various apparatuses in the semiconductor fabrication facility (fab). The integrated circuit is built up layer by layer with a lithographic step performed by a lithographic apparatus at each layer and other fab processes being performed in between lithographic steps.

The accurate placement of patterns on the substrate is a chief challenge for reducing the size of circuit components and other products that may be produced by lithography. In particular, the challenge of measuring accurately the features on a substrate which have already been laid down is a critical step in being able to align successive layers of features in superposition accurately enough to produce working devices with a high yield So-called overlay should, in general, be achieved within a few tens of nanometers in today's submicron semiconductor devices, down to a few nanometers in the most critical layers.

Consequently, modern lithography apparatuses involve extensive measurement or 'mapping' operations prior to the step of actually exposing or otherwise patterning the substrate at a target location So-called advanced alignment models have been and continue to be developed to model and correct more accurately non-linear distortions of the wafer 'grid' that are caused by processing steps and/or by the lithographic apparatus itself. Not all distortions are correctable during exposure, however, and it remains important to trace and eliminate as many causes of such distortions as possible.

These distortions of the wafer grid are represented by measurement data associated with mark position. The measurement data are obtained from measurements of wafers. An example of such measurements are alignment measurements of alignment marks performed using an alignment system in a lithographic apparatus prior to exposure. Another example of such measurements are overlay measurements of overlay targets performed using a metrology system after exposure.

Due to processing, alignment marks and overlay targets are deformed, which results in measurement errors, causing an overlay penalty. Mitigation of the impact of this deformation is conventionally performed by selecting or weighting the illumination color used for the measurements. In an example, the mitigation can be, for example, via a substrate model configured to model the deformation of a substrate. In some applications, such substrate model should accurately model the deformations based on a sparse layout measurements in order to maintain a throughput requirement of the lithographic process.

SUMMARY

In patterning processes, it is desirable to make measurements of the structures created, e.g., for process control and verification. The present disclosure aims to improve alignment and overlay performance in lithographic processes while maintaining high throughput. The alignment model to determine substrate deformations that may be used for improving alignment, improving metrology and improved correction of a lithographic process, while avoiding or at least mitigating one or more of the associated problems such as maintaining throughput.

In an embodiment, there is provided a method for determining an alignment model associated with a mark layout. The method comprises obtaining (a) first measurement data associated with a relatively dense sparse mark layout in comparison with a relatively sparse mark layout and a second measurement data associated with the relatively sparse mark layout, (b) a first fitted model that describes object deformation for the relatively dense mark layout; and (c) determining the alignment model based on a second fitted model that describes object deformation for the relatively sparse mark layout, via, or by means of, a fitting technique, preferably an oblique fitting technique.

In one embodiment, the mark layout may be alignment mark layout. Therefore, in that embodiment, the relative sparse mark layout is a relatively sparse alignment mark layout and the relative dense mark layout is a relatively dense alignment mark layout. In another embodiment, the mark layout may be overlay mark layout. Therefore, in that embodiment, the relative sparse mark layout is a relatively sparse overlay mark layout and the relative dense mark layout is a relatively dense overlay mark layout. In another embodiment, the mark layout may be both overlay and alignment, using a relatively sparse alignment mark layout and a relatively dense overlay mark layout.

In an embodiment, the fitting technique uses the first and the second measurement data.

In an embodiment, the fitting technique is a generalized least squares fitting, GLSF, employing an oblique inner product matrix, i.e., the fitting technique is a GLSF algorithm.

In an embodiment, the determination of the oblique inner product matrix comprises the following steps: determining a first output using the first fitted model and the first measurement data; determining a second output using the oblique inner product matrix, the second fitted model, the second measurement data and the first fitted model; and determining coefficients of the oblique inner product matrix such that a difference between the first fitted model and the second fitted model is reduced.

In one embodiment the difference between the first fitted model and the second fitted models may be reduced by reducing the difference between the first and the second outputs. In a further embodiment, the difference between the first and the second outputs is minimized.

In another embodiment, the coefficients of the oblique inner product matrix are determined such that the difference between the first and the second outputs is reduced. In a further embodiment, the difference between the first and the second outputs is minimized.

In an embodiment, the fitting technique oblique projection least squares fitting, OPF, employing an oblique projection matrix, i.e., the fitting technique is a OPF algorithm. In one embodiment, the OPF algorithm comprises applying an oblique projection matrix and performing a normal least squares fit.

In an embodiment, the determination of the oblique projection matrix comprises the following steps: determining a first output using the first fitted model and the first measurement data; determining a second output using the oblique projection matrix, the second fitted model, the second measurement data and the first fitted model; and determining coefficients of the oblique projection matrix such that a difference between the first fitted model and the second fitted model is reduced.

In one embodiment the difference between the first fitted model and the second fitted model may be reduced by reducing the difference between the first and the second outputs. In a further embodiment, the difference between the first and the second outputs is minimized.

In another embodiment, the coefficients of the oblique projection matrix are determined such that the difference between the first and the second outputs is reduced. In a further embodiment, the difference between the first and the second outputs is minimized.

As it has been commented above, the first output may provide a representation of a dense mark layout which may be more accurate data because it comprises more measurements. Modeling the measurements from the relative sparse mark layout does not provide an accurate approximation of model results from the measurements on the dense mark layout due to the crosstalk between the information of the sparse mark layout and of the dense mark layout. Therefore, the present invention allows to modify the coefficients used in the second fitted model taking into account the measurements or the information derived from the dense sparse mark layout. Advantageously, the present invention eliminates said crosstalk provides a more accurate fitting for measurement data associated with a relatively sparse mark layout, increasing the accuracy of the measurements and reducing the overlay between layers.

It should be understood that any of the previous embodiments and any of the claimed embodiments may be considered as a computer implemented method. Thus, said embodiments can be considered as a computer implemented method for determining an alignment model associated with an alignment mark layout.

Furthermore, in an embodiment, there is provided a computer program product comprising a non-transitory computer readable medium having instructions recorded thereon, the instructions when executed by a computer implementing the steps of any of the above embodiments. In a further embodiment, there is provided a measurement system comprising the above computer program product. In other embodiment, there is provided a lithography apparatus comprise said measurement system.

BRIEF DESCRIPTION OF THE DRAWINGS

Embodiments will now be described, by way of example only, with reference to the accompanying drawings in which.

Embodiments will now be described in detail with reference to the drawings, which are provided as illustrative examples so as to enable those skilled in the art to practice the embodiments. Notably, the figures and examples below are not meant to limit the scope to a single embodiment, but other embodiments are possible by way of interchange of some or all of the described or illustrated elements. Wherever convenient, the same reference numbers will be used throughout the drawings to refer to same or like parts. Where certain elements of these embodiments can be partially or fully implemented using known components, only those portions of such known components that are necessary for an understanding of the embodiments will be described, and detailed descriptions of other portions of such known components will be omitted so as not to obscure the description of the embodiments. In the present specification, an embodiment showing a singular component should not be considered limiting; rather, the scope is intended to encompass other embodiments including a plurality of the same component, and vice-versa, unless explicitly stated otherwise herein. Moreover, applicants do not intend for any term in the specification or claims to be ascribed an uncommon or special meaning unless explicitly set forth as such. Further, the scope encompasses present and future known equivalents to the components referred to herein by way of illustration.

DETAILED DESCRIPTION

Before describing embodiments in detail, it is instructive to present an example environment in which embodiments may be implemented.

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range of about 5-100 nm).

The term "reticle", "mask" or "patterning device" as employed in this text may be broadly interpreted as referring to a generic patterning device that can be used to endow an incoming radiation beam with a patterned cross-section, corresponding to a pattern that is to be created in a target portion of the substrate. The term "light valve" can also be used in this context. Besides the classic mask (transmissive or reflective, binary, phase-shifting, hybrid, etc.), examples of other such patterning devices include a programmable mirror array and a programmable LCD array.

Figure 1:
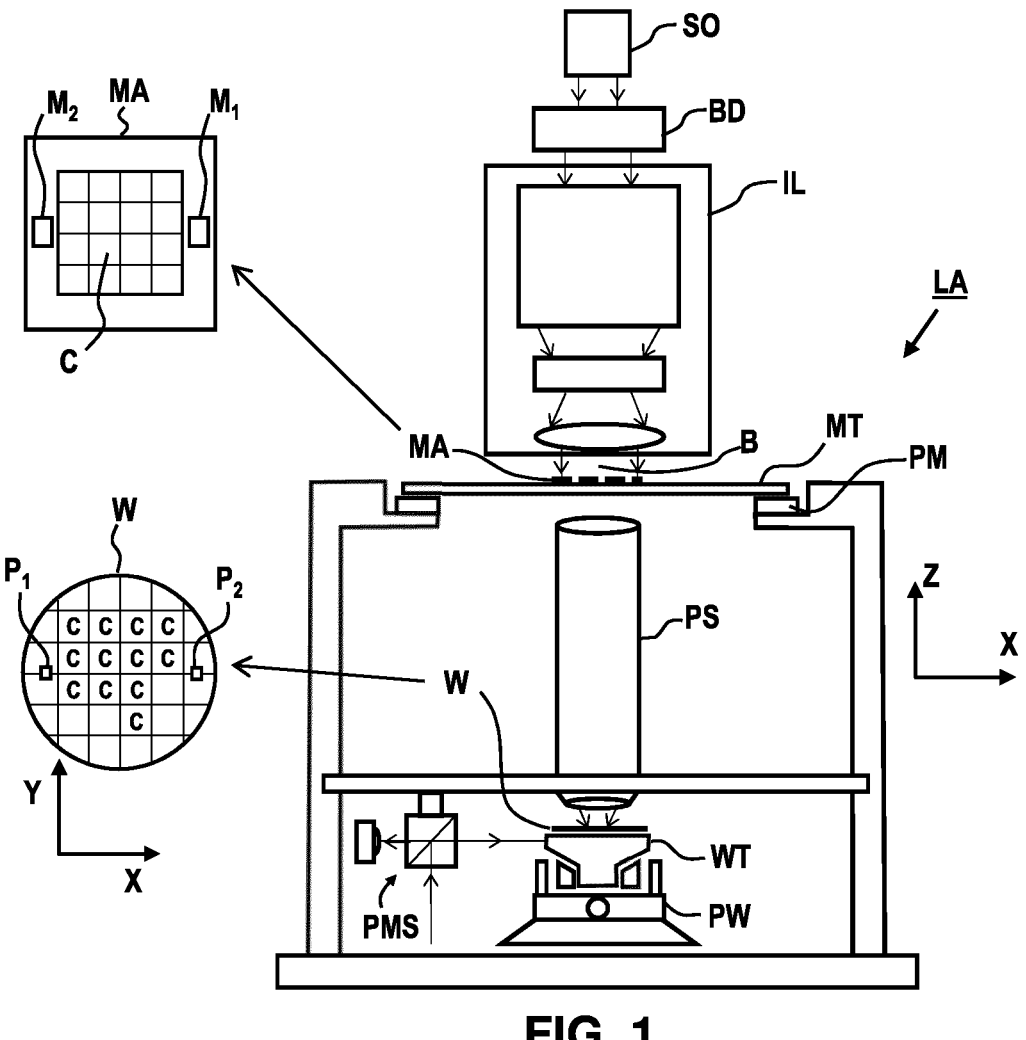
FIG. 1 depicts a schematic overview of a lithographic apparatus, according to an embodiment.

FIG. 1 schematically depicts a lithographic apparatus LA. The lithographic apparatus LA includes an illumination system (also referred to as illuminator) IL configured to condition a radiation beam B (e.g., UV radiation, DUV radiation or EUV radiation), a mask support (e.g., a mask table) MT constructed to support a patterning device (e.g., a mask) MA and connected to a first positioner PM configured to accurately position the patterning device MA in accordance with certain parameters, a substrate support (e.g., a wafer table) WT constructed to hold a substrate (e.g., a resist coated wafer) W and connected to a second positioner PW configured to accurately position the substrate support in accordance with certain parameters, and a projection system (e.g., a refractive projection lens system) PS configured to project a pattern imparted to the radiation beam B by patterning device MA onto a target portion C (e.g., comprising one or more dies) of the substrate W.

In operation, the illumination system IL receives a radiation beam from a radiation source SO, e.g. via a beam delivery system BD. The illumination system IL may include various types of optical components, such as refractive, reflective, magnetic, electromagnetic, electrostatic, and/or other types of optical components, or any combination thereof, for directing, shaping, and/or controlling radiation. The illuminator IL may be used to condition the radiation beam B to have a desired spatial and angular intensity distribution in its cross section at a plane of the patterning device MA.

The term "projection system" PS used herein should be broadly interpreted as encompassing various types of projection system, including refractive, reflective, catadioptric, anamorphic, magnetic, electromagnetic and/or electrostatic optical systems, or any combination thereof, as appropriate for the exposure radiation being used, and/or for other factors such as the use of an immersion liquid or the use of a vacuum. Any use of the term "projection lens" herein may be considered as synonymous with the more general term "projection system" PS.

The lithographic apparatus LA may be of a type wherein at least a portion of the substrate may be covered by a liquid having a relatively high refractive index, e.g., water, so as to fill a space between the projection system PS and the substrate W—which is also referred to as immersion lithography. More information on immersion techniques is given in U.S. Pat. No. 6,952,253, which is incorporated herein by reference.

The lithographic apparatus LA may also be of a type having two or more substrate supports WT (also named "dual stage"). In such "multiple stage" machine, the substrate supports WT may be used in parallel, and/or steps in preparation of a subsequent exposure of the substrate W may be carried out on the substrate W located on one of the substrate support WT while another substrate W on the other substrate support WT is being used for exposing a pattern on the other substrate W.

In addition to the substrate support WT, the lithographic apparatus LA may comprise a measurement stage. The measurement stage is arranged to hold a sensor and/or a cleaning device. The sensor may be arranged to measure a property of the projection system PS or a property of the radiation beam B. The measurement stage may hold multiple sensors. The cleaning device may be arranged to clean part of the lithographic apparatus, for example a part of the projection system PS or a part of a system that provides the immersion liquid. The measurement stage may move beneath the projection system PS when the substrate support WT is away from the projection system PS.

In operation, the radiation beam B is incident on the patterning device, e.g. mask, MA which is held on the mask support MT, and is patterned by the pattern (design layout) present on patterning device MA. Having traversed the mask MA, the radiation beam B passes through the projection system PS, which focuses the beam onto a target portion C of the substrate W. With the aid of the second positioner PW and a position measurement system IF, the substrate support WT can be moved accurately, e.g., so as to position different target portions C in the path of the radiation beam B at a focused and aligned position. Similarly, the first positioner PM and possibly another position sensor (which is not explicitly depicted in FIG. 1) may be used to accurately position the patterning device MA with respect to the path of the radiation beam B. Patterning device MA and substrate W may be aligned using mask alignment marks M1, M2 and substrate alignment marks P1, P2. Although the substrate alignment marks P1, P2 as illustrated occupy dedicated target portions, they may be located in spaces between target portions. Substrate alignment marks P1, P2 are known as scribe-lane alignment marks when these are located between the target portions C.

To clarify the invention, a Cartesian coordinate system is used. The Cartesian coordinate system has three axis, i.e., an x-axis, a y-axis and a z-axis. Each of the three axis is orthogonal to the other two axis. A rotation around the x-axis is referred to as an Rx-rotation. A rotation around the y-axis is referred to as an Ry-rotation. A rotation around about the z-axis is referred to as an Rz-rotation. The x-axis and the y-axis define a horizontal plane, whereas the z-axis is in a vertical direction. The Cartesian coordinate system is not limiting the invention and is used for clarification only. Instead, another coordinate system, such as a cylindrical coordinate system, may be used to clarify the invention. The orientation of the Cartesian coordinate system may be different, for example, such that the z-axis has a component along the horizontal plane.

In the manufacture of complex devices, typically many lithographic patterning steps are performed, thereby forming functional features in successive layers on the substrate. A critical aspect of performance of the lithographic apparatus is therefore the ability to place the applied pattern correctly and accurately in relation to features laid down in previous layers (by the same apparatus or a different lithographic apparatus). For this purpose, the substrate is provided with one or more sets of marks. Each mark is a structure whose position can be measured at a later time using a position sensor, typically an optical position sensor. The position sensor may be referred to as "alignment sensor" and marks may be referred to as "alignment marks".

A lithographic apparatus may include one or more (e.g. a plurality of) alignment sensors by which positions of alignment marks provided on a substrate can be measured accurately. Alignment (or position) sensors may use optical phenomena such as diffraction and interference to obtain position information from alignment marks formed on the substrate. An example of an alignment sensor used in current lithographic apparatus is based on a self-referencing interferometer as described in U.S. Pat. No. 6,961,116. Various enhancements and modifications of the position sensor have been developed, for example as disclosed in US2015261097A1. The contents of all of these publications are incorporated herein by reference.

A mark, or alignment mark, may comprise a series of bars formed on or in a layer provided on the substrate or formed (directly) in the substrate. The bars may be regularly spaced and act as grating lines so that the mark can be regarded as a diffraction grating with a well-known spatial period (pitch). Depending on the orientation of these grating lines, a mark may be designed to allow measurement of a position along the X axis, or along the Y axis (which is oriented substantially perpendicular to the X axis). A mark comprising bars that are arranged at +45 degrees and/or −45 degrees with respect to both the X- and Y-axes allows for a combined X- and Y-measurement using techniques as described in US2009/195768A, which is incorporated by reference.

The alignment sensor scans each mark optically with a spot of radiation to obtain a periodically varying signal, such as a sine wave. The phase of this signal is analyzed, to determine the position of the mark and, hence, of the substrate relative to the alignment sensor, which, in turn, is fixated relative to a reference frame of a lithographic apparatus. So-called coarse and fine marks may be provided, related to different (coarse and fine) mark dimensions, so that the alignment sensor can distinguish between different cycles of the periodic signal, as well as the exact position (phase) within a cycle. Marks of different pitches may also be used for this purpose.

Measuring the position of the marks may also provide information on a deformation of the substrate on which the marks are provided, for example in the form of a wafer grid. Deformation of the substrate may occur by, for example, electrostatic clamping of the substrate to the substrate table and/or heating of the substrate when the substrate is exposed to radiation.

Figure 2:
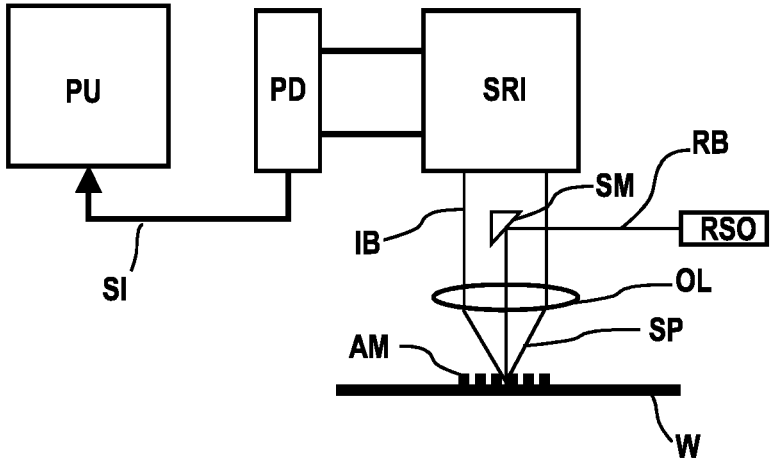
FIG. 2 schematically depicts an embodiment of a lithographic cell or cluster, according to an embodiment.

FIG. 2 is a schematic block diagram of an embodiment of a known alignment sensor, such as is described, for example, in U.S. Pat. No. 6,961,116, and which is incorporated by reference. Radiation source RSO provides a beam RB of radiation of one or more wavelengths, which is diverted by diverting optics onto a mark, such as mark AM located on substrate W, as an illumination spot SP. In this example the diverting optics comprises a spot mirror SM and an objective lens OL. The illumination spot SP, by which the mark AM is illuminated, may be slightly smaller in diameter than the width of the mark itself.

Radiation diffracted by the mark AM is collimated (in this example via the objective lens OL) into an information-carrying beam IB. The term "diffracted" is intended to include zero-order diffraction from the mark (which may be referred to as reflection). A self-referencing interferometer SRI, e.g. of the type disclosed in U.S. Pat. No. 6,961,116 mentioned above, interferes the beam IB with itself after which the beam is received by a photodetector PD. Additional optics (not shown) may be included to provide separate beams in case more than one wavelength is created by the radiation source RSO. The photodetector may be a single element, or it may comprise a number of pixels, if desired. The photodetector may comprise a sensor array.

The diverting optics, which in this example comprises the spot mirror SM, may also serve to block zero order radiation reflected from the mark, so that the information-carrying beam IB comprises only higher order diffracted radiation from the mark AM (this is not essential to the measurement, but improves signal to noise ratios).

Intensity signals SI are supplied to a processing unit PU. By a combination of optical processing in the block SRI and computational processing in the unit PU, values for X- and Y-position on the substrate relative to a reference frame are output.

A single measurement of the type illustrated only fixes the position of the mark within a certain range corresponding to one pitch of the mark. Coarser measurement techniques are used in conjunction with this to identify which period of a sine wave is the one containing the marked position. The same process at coarser and/or finer levels may be repeated at different wavelengths for increased accuracy and/or for robust detection of the mark irrespective of the materials from which the mark is made, and materials on and/or below which the mark is provided. The wavelengths may be multiplexed and de-multiplexed optically so as to be processed simultaneously, and/or they may be multiplexed by time division or frequency division.

In this example, the alignment sensor and spot SP remain stationary, while it is the substrate W that moves. The alignment sensor can thus be mounted rigidly and accurately to a reference frame, while effectively scanning the mark AM in a direction opposite to the direction of movement of substrate W. The substrate W is controlled in this movement by its mounting on a substrate support and a substrate positioning system controlling the movement of the substrate support. A substrate support position sensor (e.g. an interferometer) measures the position of the substrate support (not shown). In an embodiment, one or more (alignment) marks are provided on the substrate support. A measurement of the position of the marks provided on the substrate support allows the position of the substrate support as determined by the position sensor to be calibrated (e.g. relative to a frame to which the alignment system is connected). A measurement of the position of the alignment marks provided on the substrate allows the position of the substrate relative to the substrate support to be determined.

Alignment Process Background

Figure 3:
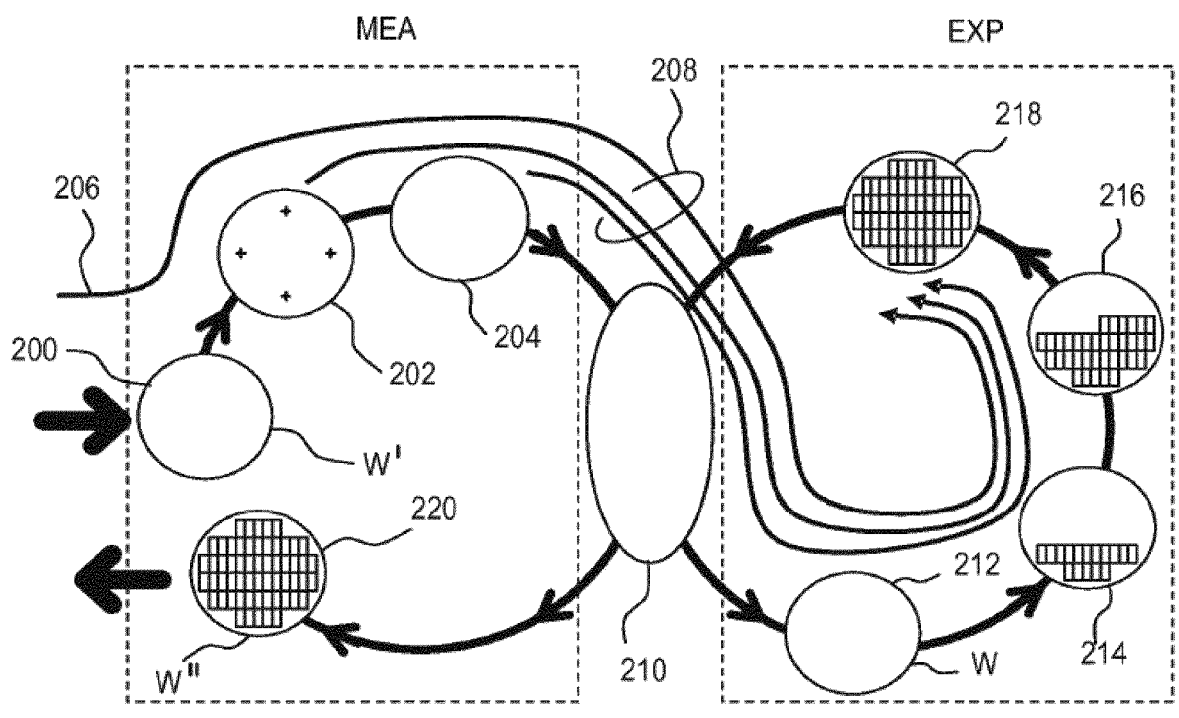
FIG. 3 illustrates schematically measurement and exposure processes in the apparatus of FIG. 1, according to known practice.

FIG. 3 illustrates the steps to expose target portions (e.g. dies) on a substrate W in the dual stage apparatus of FIG. 1. The process according to conventional practice will be described first.

On the left hand side within a dotted box are steps performed at measurement station MEA, while the right hand side shows steps performed at exposure station EXP. From time to time, one of the substrate tables WTa, WTb will be at the exposure station, while the other is at the measurement station, as described above. For the purposes of this description, it is assumed that a substrate W has already been loaded into the exposure station. At step 200, a new substrate W' is loaded to the apparatus by a mechanism not shown. These two substrates are processed in parallel in order to increase the throughput of the lithographic apparatus.

Referring initially to the newly-loaded substrate W', this may be a previously unprocessed substrate, prepared with a new photo resist for first time exposure in the apparatus. In general, however, the lithography process described will be merely one step in a series of exposure and processing steps, so that substrate W' has been through this apparatus and/or other lithography apparatuses, several times already, and may have subsequent processes to undergo as well. Particularly for the problem of improving overlay performance, the task is to ensure that new patterns are applied in exactly the correct position on a substrate that has already been subjected to one or more cycles of patterning and processing. Each patterning step can introduce positional deviations in the applied pattern, while subsequent processing steps progressively introduce distortions in the substrate and/or the pattern applied to it, that must be measured and corrected for, to achieve satisfactory overlay performance.

The previous and/or subsequent patterning step may be performed in other lithography apparatuses, as just mentioned, and may even be performed in different types of lithography apparatus. For example, some layers in the device manufacturing process which are very demanding in parameters such as resolution and overlay may be performed in a more advanced lithography tool than other layers that are less demanding. Therefore some layers may be exposed in an immersion type lithography tool, while others are exposed in a 'dry' tool. Some layers may be exposed in a tool working at DUV wavelengths, while others are exposed using EUV wavelength radiation. Some layers may be patterned by steps that are alternative or supplementary to exposure in the illustrated lithographic apparatus. Such alternative and supplementary techniques include for example imprint lithography, self-aligned multiple patterning and directed self-assembly.

At 202, alignment measurements using the substrate marks P1 etc. and image sensors (not shown) are used to measure and record alignment of the substrate relative to substrate table WTa/WTb. In addition, several alignment marks across the substrate W' will be measured using alignment sensor AS. These measurements are used in one embodiment to establish a substrate model (sometimes referred to as the "wafer grid"), which maps very accurately the distribution of marks across the substrate, including any distortion relative to a nominal rectangular grid.

At step 204, a map of wafer height (Z) against X-Y position is measured also using the level sensor LS. Primarily, the height map is used only to achieve accurate focusing of the exposed pattern. It may be used for other purposes in addition.

When substrate W' was loaded, recipe data 206 were received, defining the exposures to be performed, and also properties of the wafer and the patterns previously made and to be made upon it. To these recipe data are added the measurements of wafer position, wafer grid and height map that were made at 202, 204, so that a complete set of recipe and measurement data 208 can be passed to the exposure station EXP. The measurements of alignment data for example comprise X and Y positions of alignment targets formed in a fixed or nominally fixed relationship to the product patterns that are the product of the lithographic process. These alignment data, taken just before exposure, are used to generate an alignment model with parameters that fit the model to the data. These parameters and the alignment model will be used during the exposure operation to correct positions of patterns applied in the current lithographic step. The model in use interpolates positional deviations between the measured positions. A conventional alignment model might comprise four, five or six parameters, together defining translation, rotation and scaling of the 'ideal' grid, in different dimensions. As described further in US 2013230797A1, advanced models are known that use more parameters.

At 210, wafers W' and W are swapped, so that the measured substrate W' becomes the substrate W entering the exposure station EXP. In the example apparatus of FIG. 1, this swapping is performed by exchanging the supports WTa and WTb within the apparatus, so that the substrates W, W' remain accurately clamped and positioned on those supports, to preserve relative alignment between the substrate tables and substrates themselves. Accordingly, once the tables have been swapped, determining the relative position between projection system PS and substrate table WTb (formerly WTa) is all that is necessary to make use of the measurement information 202, 204 for the substrate W (formerly W') in control of the exposure steps. At step 212, reticle alignment is performed using the mask alignment marks M1, M2. In steps 214, 216, 218, scanning motions and radiation pulses are applied at successive target locations across the substrate W, in order to complete the exposure of a number of patterns.

By using the alignment data and height map obtained at the measuring station in the performance of the exposure steps, these patterns are accurately aligned with respect to the desired locations, and, in particular, with respect to features previously laid down on the same substrate. The exposed substrate, now labeled W" is unloaded from the apparatus at step 220, to undergo etching or other processes, in accordance with the exposed pattern.

Advanced Process Control Using Historical Performance Data

Figure 4:
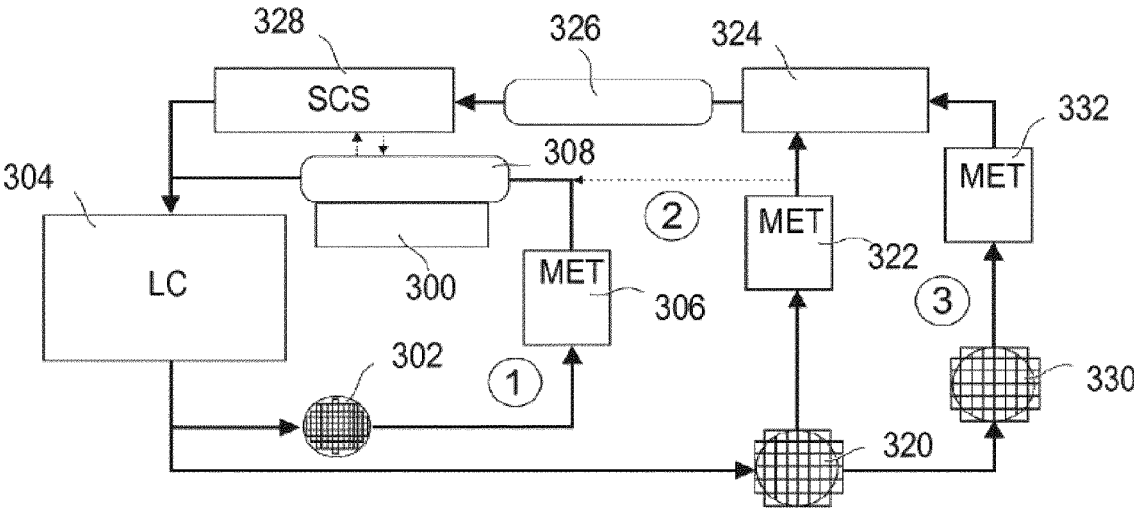
FIG. 4 is a schematic diagram of an advanced process control method for controlling the apparatus of FIG. 1 according to known practice.

For best performance, historical performance data relating to the lithography process are generally used in addition to measurements made when a current substrate is loaded into the lithographic apparatus. For this purpose, measurements of performance are made with the metrology system MET (FIG. 2). Different forms of advanced process control can be implemented. FIG. 4 illustrates only one example, implementing a known stability control method.

FIG. 4 depicts a stability module 300. This module is for example an application running on a processor. Shown are three main process control loops, labeled 1, 2, 3. The first loop provides local control of the lithography apparatus using the stability module 300 and monitor wafers. A monitor wafer 302 is shown being passed from a lithography cell 304, which may be the lithocell LC of FIG. 2 for example. Monitor wafer 302 has been exposed with a calibration pattern to set 'baseline' parameters for focus and overlay. At a later time, a metrology tool 306 reads these baseline parameters, which are then interpreted by the stability module 300 so as to calculate stability corrections 308 specific to this lithocell. This performance data can be fed back to the lithography cell 304, and used when performing further exposures. The exposure of the monitor wafer may involve printing a pattern of marks on top of reference marks. By measuring overlay error between the top and bottom marks, deviations in performance of the lithographic apparatus can be measured, even when the wafers have been removed from the apparatus and placed in a metrology tool.

The second (APC) control loop is based on measurements of performance parameters such as focus, dose, and overlay on actual product wafers. An exposed product wafer 320 is passed to metrology tool 322, which may be the same or different to the metrology tool 306 in the first control loop. At 322 information relating for example to parameters such as critical dimension, sidewall angles and overlay is determined and passed to an Advanced Process Control (APC) module 324. This data is also passed to the stability module 300. Process corrections 326 are calculated and used by the supervisory control system (SCS) 328, providing control of the lithocell 304, in communication with the stability module 300.

The third control loop is to allow metrology integration into the second (APC) control loop, for example in double patterning applications. An etched wafer 330 is passed to metrology unit 332 which again may be the same or different to the metrology tool 306, 322 used in the first and/or second control loop. Metrology tool 332 measures performance parameters such as critical dimensions, sidewall angles and overlay, read from the wafer. These parameters are passed to the Advanced Process Control (APC) module 324. The loop continues the same as with the second loop.

Substrate Model Mapping—Background

For overlay performance, new patterns should be positioned correctly relative to patterns already on the substrate, not merely positioned at some nominally 'correct' position. From the above description, it will be understood that several different mechanisms are implemented to achieve high performance in parameters such as overlay.

Figure 5:
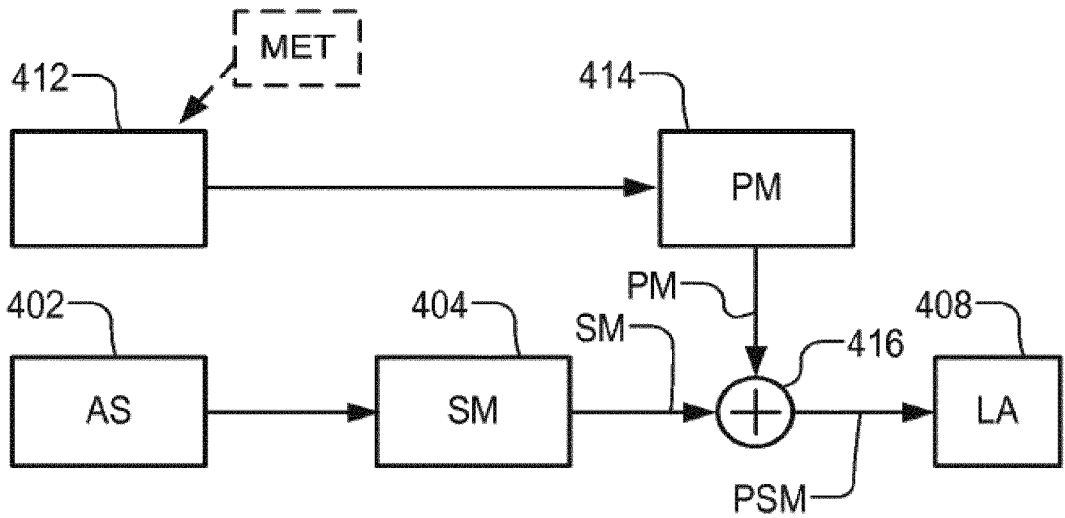
FIG. 5 illustrates the implementation of a substrate model and a process model in the method of FIG. 4 according to an embodiment.

FIG. 5 summarizes these mechanisms, as they relate to a patterning operation on a current substrate, in the known method of controlling the lithographic apparatus LA. At 402 positional deviations of a current substrate are measured by the lithographic apparatus using its alignment sensors AS, in the manner described with reference to FIG. 3. At 404 a substrate model SM is calculated from the position measurements of the current substrate that allows substrate-specific corrections to be applied by the lithographic apparatus at 408 when a pattern is applied.

In addition, at 412 measurements of performance on prior substrates are stored to provide historical performance data. This historical performance data is used at 414 to calculate one or more process models PM representing the performance of the particular lithographic apparatus and other processing equipment relevant to the current substrate. These calculations may for example the ones done in the control loops of the example of FIG. 4.

At 416 the substrate model and the process model(s) are combined to create a complete substrate and process correction model PSM. Using the combined model, lithographic apparatus 408 calculates corrections so that a new pattern can be applied to each substrate, correcting not only for positional deviations in the features already on the substrate, but also for deviations in performance of the patterning and other processing steps.

Ideally, the substrate model would correct only those deviations that are not corrected by the process model, and vice versa. The inventors have recognized that in the known system, an element of correlation can arise between alignment deviations corrected by via substrate model and overlay errors corrected via the process model. Such correlation can result in over-correction or under-correction of errors. According to the present disclosure, by identifying and eliminating these correlations, the performance of the lithographic process as a whole can be further improved, particularly in terms of overlay.

While a process model PM and a substrate model SM may be referred to in the singular, the skilled reader will understand that either or both of these models may be a superposition of two of more sub-models. The process model may comprise sub-models for performance of the lithographic apparatus and performance of the other processing steps, but all models based on the historical performance data are simply regarded to as the process model, for simplicity in the present disclosure. As a common example, the process model may comprise an inter-field model and an intra-field model. The inter-field model represents variations in performance that are related to position over the substrate, while the intra-field model represents variations that tend to repeat in each target portion (field) of the substrate. Each of these can be further sub-divided into sub-models. Either or both of these models may comprise a sub-model specific to a particular product design and a sub-model common to a number of product designs. Additional models can apply corrections for transient effects, such as heating of the lens, the reticle and/or the substrate. The stability module creates another sub-model, representing day-to-day drift of actual performance from a process model based on historical performance measurements.

Similarly, the substrate model may in practice comprise a combination of two or more sub-models. Commonly for example, a four-parameter (4PAR) model will be fitted first. A second model with higher order variations is then fitted on the residuals of the 4PAR model. (The residuals include positional deviations not modeled by the 4PAR model.) The higher order model may be for example a six-parameter (6PAR) model, a 3rd order polynomial model, or a model based on radial basis functions. The term 'substrate model' therefore encompasses combination of two or more sub-models. Furthermore, as with the process model, the substrate model can comprise an intra-field model as well as inter-field model. In one example, multiple alignment marks are measured for a small number of fields on the current substrate, and are used to fit an intra-field substrate model. In that case, the substrate model is effectively a combination of three sub-models: a 4PAR substrate model, higher order inter-field substrate model and an intra-field substrate model. Each successive model represents smaller and smaller deviations, but each one helps to reduce overlay another small amount, which is critical in modern semiconductor manufacturing.

Current wafer alignment fit uses a least squares technique (e.g., characterized by matrix computation as $(M^T M)^{-1} M^T$) to determine the alignment model (e.g., the substrate model discussed earlier) that fits measurement data associated with a wafer mark layout. The fitted model can generate a grid that describes the deformations of the wafer. In an embodiment, the measurement data can be obtained as discussed earlier in FIG. 4. For example, the measurement data includes position (e.g., X, Y) measurements, height (e.g., Z) measurements at marks of the wafer alignment mark layout.

In some cases, a sparse mark layout is used for wafer alignment in order to maintain a throughput requirement of a patterning process. In an embodiment, a sparse mark layout (also referred as a sparse layout) includes relatively less number of marks compared to a dense layout. For example, a sparse layout may include less than 65 marks (e.g., approximately 1 mark per die of the wafer) while a dense layout includes more than 200 marks (e.g., multiple marks per die of the wafer). As such, measurement data corresponding to the sparse layout will have relatively less compared to measurement data for the dense layout. Hence, model trained on the sparse layout data may not describe the substrate accurately.

With a denser mark layout (e.g., a layout 810 in FIG. 8B) compared to the sparse mark layout (e.g., a layout 800 in FIG. 8A), better model can be obtained. To bridge the gap between models fitted based dense layout and sparse layout, a Wafer Alignment Model Mapping (WAMM) was proposed in a PCT patent application Ser. No. 15/763,780 filed on Sep. 15, 2016, which is incorporated herein in its entirety. Using the WAMM with e.g., 65 marks, a performance level similar to 100 mark pairs may be obtained.

However, there are two performance related aspects of sparse versus dense wafer mark layout: (i) a sparse mark layout results in less noise suppression (or dimensionality reduction), and (ii) a sparse mark layout results in more crosstalk from non-correctable component to correctable components. The correctable component are components that can be modeled by the wafer model and the non-correctable components are residuals associated with the wafer model.

In an embodiment, the wafer model models a deformation of a wafer surface. Accordingly, the correctable component refers to deformations described by the wafer model and the non-correctable component refers to residuals of the wafer model. In practice, residuals are strongest at an edge of a wafer and also deformations may be relatively higher at the edge of the wafer compared to at a center of the wafer.

In an embodiment, partial noise suppression may be improved effectively by using WAMM or subspace modeling (e.g., as discussed in PCT patent application Ser. No. 15/763,780). For example, by reducing the number of dimensions of the model space, the noise suppression (scheme factor) improves. However, crosstalk between correctable and non-correctable components may exist when a least squares alignment fit is used to determine the wafer alignment model. Thus, WAMM needs further improvements for bridging the gap between sparse and dense alignment layouts.

During the known least square fitting process of WAMM, the non-correctable components (or shapes) are projected on the correctable components (or shapes) by the WAMM model, and are therefore more difficult to discriminate from the correctable shapes.

When going from a dense to a sparse alignment grid, the orthogonality relations between the correctable and non-correctable components change: on the dense layout the correctable and non-correctable components are orthogonal, while on the sparse layout they are not. This non-orthogonality associated with the sparse layout leads to crosstalk. According to the present disclosure, the crosstalk can be reduced via an oblique fitting technique. In an embodiment, the oblique fitting technique comprises a generalized least squares fit (e.g., a generalized least squares fitting, method

600 discussed later) or oblique projection least squares fit (e.g., oblique projection least squares fitting, method 700 discussed later).

In an embodiment, the generalized least squares fit involves modifying an inner product element associated with the sparse layout such that the orthogonality between correctable and non-correctable components is similar to the dense layout. In an embodiment, such modification involves basing the inner product of the sparse layout on a different (non-orthogonal) basis.

In an embodiment, oblique projection least squares fit involves an oblique projection in the least squares fit to block the crosstalk.

According to the present disclosure, the generalized least squares fit is discussed as follows. An inner product can be computed using $\langle x,y \rangle = x^T y$, where x and y are column vectors containing the measurement data, i.e., alignment measurement data or overlay measurement data, at different mark locations on the wafer. Then, a norm associated with this inner product can be calculated as $\|x\| = \sqrt{\langle x,x \rangle} = \sqrt{x^T x}$.

Now, assume that y comprises densely measured alignment data (or uncorrected overlay data) associated with the dense layout, i.e., the first measurement data. Then, the correctable component ($y_{correctable}$) of the dense layout data can be computed using:

In case of ordinary least square the fit coefficients are optimized using the least squares norm described above. It can be shown that the result of this optimization can be computed using $$c_y = M_y^+ y = \left( M_y^T M_y \right)^{-1} M_y^T y,$$

where the '+' operator stands for the pseudo inverse of a matrix.

By combining the previous two equations of $y_{correctable}$ and $c_y$, $$y_{correctable} = M_y c_y = M_y M_y^+ y = M_y \left( M_y^T M_y \right)^{-1} M_y^T y = P_y y$$

where $P_y$ is an orthogonal projection matrix that projects the measured data y on the space spanned by the columns of model matrix $M_y$, which results in the correctable component $y_{correctable}$. Thus conceptually, conventional wafer alignment using a least squares fit can be considered as an orthogonal projection of the measured data on the space spanned by the model, using the inner product.

According to the present disclosure, the oblique inner product between two column vectors x and y is computed as $\langle x,y \rangle_w = x^T W^T W y$. And, the oblique norm as $\|x\|_w = \sqrt{\langle x,x \rangle_w} = \sqrt{x^T W^T W x}$, where the matrix W can be considered a base transformation matrix (i.e., the oblique inner product matrix). The inner product and norm are the new inner product and norm defined on the new oblique base, according to the present disclosure.

Consider that x contains sparse wafer alignment measurement data (i.e., the second measurement data) and y contains dense wafer alignment data (or uncorrected overlay measurement data, i.e., the first measurement data). It can be shown that the fit coefficients from the generalized least squares fit, using the oblique norm can be written as:

$$c_w = \left(M_x^T W^T W M_x\right)^{-1} M_x^T W^T W x$$
$$= (W M_x)^+ W x$$

In an embodiment, these fit coefficients $c_w$ are used to approximate the dense layout alignment data (or uncorrected dense overlay data), and optimize the oblique inner product matrix W.

In an embodiment, an approximation of the wafer alignment model associated with the sparse layout is performed in cooperation with the model associated with the dense layout. Such wafer alignment model can be computed by executing following equations:

$$x_{correction} = M_y c_w$$
$$= M_y \left(M_x^T W^T W M_x\right)^{-1} M_x^T W^T W x$$
$$= M_y (W M_x)^+ W x$$

In an embodiment, the coefficients in matrix W are optimized such that the wafer alignment model associated with the sparse layout closely approximates results of the dense layout data (or uncorrected overlay data). The coefficients of W are determined by executing the following equation:

$$W = \underset{w}{\operatorname{argmin}} \left\| y_{correctable} - x_{correction}(W) \right\|$$
$$= \underset{w}{\operatorname{argmin}} \left\| M_y M_y^+ y - M_y (W M_x)^+ W x \right\|$$

In case the matrix W is invertible, the crosstalk between correctable and non-correctable components of the alignment model can be suppressed by the generalized least squares fit. If the matrix is non-invertible, the generalized least squares fit can not only suppress the crosstalk but also correct for deteriorated noise propagation by means of dimensionality reduction. Note that the optimal matrix W depends on the sparse layout that is used as well as the kind of deformations and the noise levels present in the data. Therefore, either training wafers or historical data may be required for fitting as well as verifying the fitted model. Also note that if y contains dense alignment layout data, the sparse alignment model results are being optimized to match the dense alignment result as close as possible. While if y contains dense uncorrected overlay data W is optimized for overlay directly. These are two separate applications.

In an embodiment, four classes for the inner product matrix W can be identified: (i) Identity matrix; (ii) Diagonal matrix that can be used to give more weight to alignment marks in less densely sampled areas of the wafer or less weight to more noisy alignment scans; (iii) Invertible matrix used in the generalized least squares fitting of the present disclosure. The basis on which the inner product and norm are based is not orthogonal. This inner product can reduce crosstalk from non-correctable component to correctable component by choosing matrix W as discussed herein; and (iv) Non-invertible matrix which can be seen as combined generalized least squares with (oblique) subspace modeling, as a non-invertible matrix reduces the number of degrees of freedom in the data (e.g., oblique projection to a subspace of the data only). This approach can reduce both crosstalk and noise propagation. This approach (iv) may be solved by the oblique projection least squares fitting employing an oblique projection matrix.

The oblique projection least squares fitting briefly discussed below and further elaborated in method 700 of FIGS. 7A and 7B. In the oblique projection least squares fitting, the following equation is executed.

$$c_P = \left(M_x^T M_x\right)^{-1} M_x^T P x$$
$$= M_x^+ P x$$

where, P is an oblique projection matrix. As the non-correctable component on the dense alignment layout is not orthogonal to the correctable component on the sparse alignment layout, it can be blocked using an oblique projection matrix as long as the correctable and non-correctable are at least linearly independent on the sparse grid.

In an embodiment, matrix P (i.e., oblique projection matrix) is optimized such that the sparse wafer alignment model result matches as closely as possible with the dense alignment data (or dense de-corrected overlay data). For example, determining values of the coefficients in matrix P, under the constraint of it being an oblique projection matrix (e.g., a matrix diagnosable with each eigenvalues either equal to 0 or 1). In an embodiment, the optimization is performed iteratively executing the following model, such that the values of coefficients of P progressively reduces (e.g., in an embodiment minimizes) the aforementioned difference.

$$P = \underset{P \text{ being a oblique projection matrix}}{\operatorname{argmin}} \left\| y_{correctable} - M_y c_p \right\|$$
$$= \underset{P \text{ being a oblique projection matrix}}{\operatorname{argmin}} \left\| M_y \left(M_y^+ y - M_x^+ P x\right) \right\|$$

Figure 6:
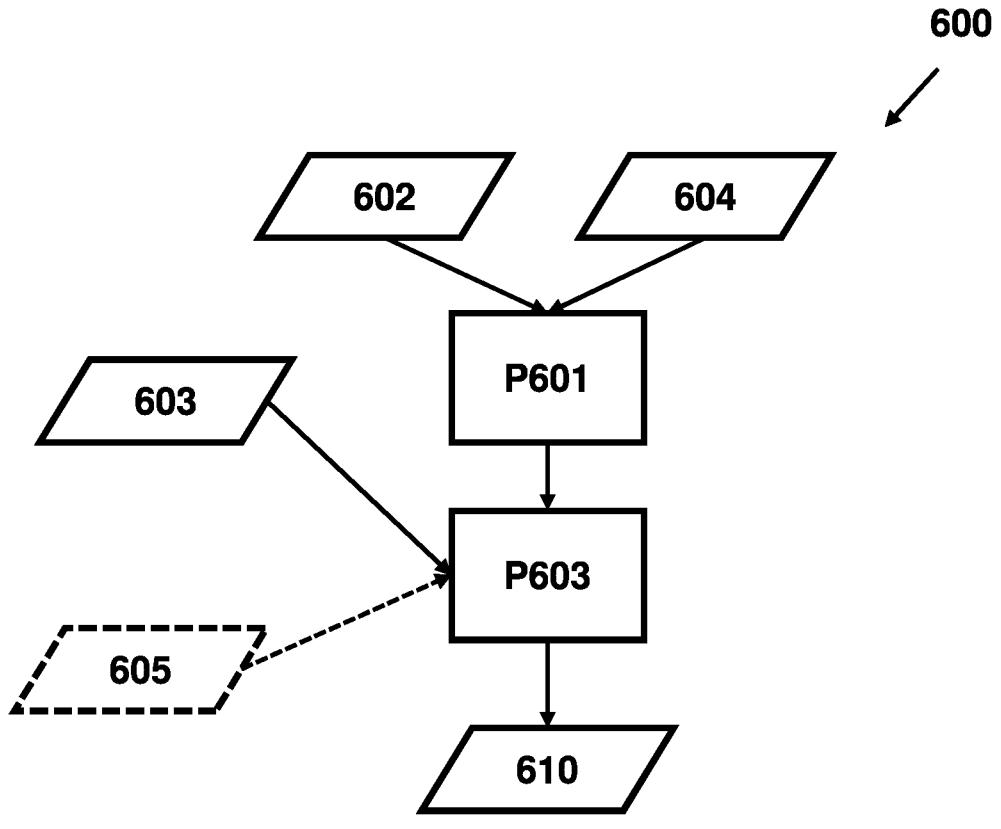
FIG. 6 is a flow chart for determining an alignment model based on sparse layout according to an embodiment.

FIG. 6 is a flow chart for a method 600 of determining an alignment model 610 associated with a mark. The alignment model can be used to make substrate specific corrections to be applied by the lithographic apparatus, as mentioned earlier, e.g., with respect to FIG. 4 and FIG. 5. In an embodiment, the process to determine the alignment model is such that noise is data is suppressed and crosstalk between components (e.g., correctable and non-correctable components) of the alignment model is substantially reduced.

In an embodiment, crosstalk associated with the alignment model the refers to a correlation between correctable and non-correctable (e.g., residuals) components. For example, the non-correctable component (e.g., residuals of the model) may appear as the correctable component of the fitted model 610, which may result in unnecessary adjustments (e.g., to substrate table, focus, etc.) to the patterning process.

The method 600 in procedure P601 includes obtaining (i) first and second measurement data 602. The first measurement data is associated with a dense sparse mark layout (e.g., 810 in FIG. 8B) in comparison with a relatively dense mark layout and the second measurement data is associated with a spare sparse mark layout (e.g., 800 in FIG. 8A). Further the method includes obtaining (ii) a first fitted model 604 (e.g., represented by matrix $M_y$ discussed earlier) that describes object deformation for the relatively dense mark layout and (iii) determining the alignment model based on a second fitted model that describes object deformation for the relatively sparse mark layout, via a fitting technique, preferably an oblique fitting technique. As it has been commented above, the relatively dense mark layout may be a relatively dense alignment mark layout 603 or dense overlay mark layout 605.

Figure 8A:
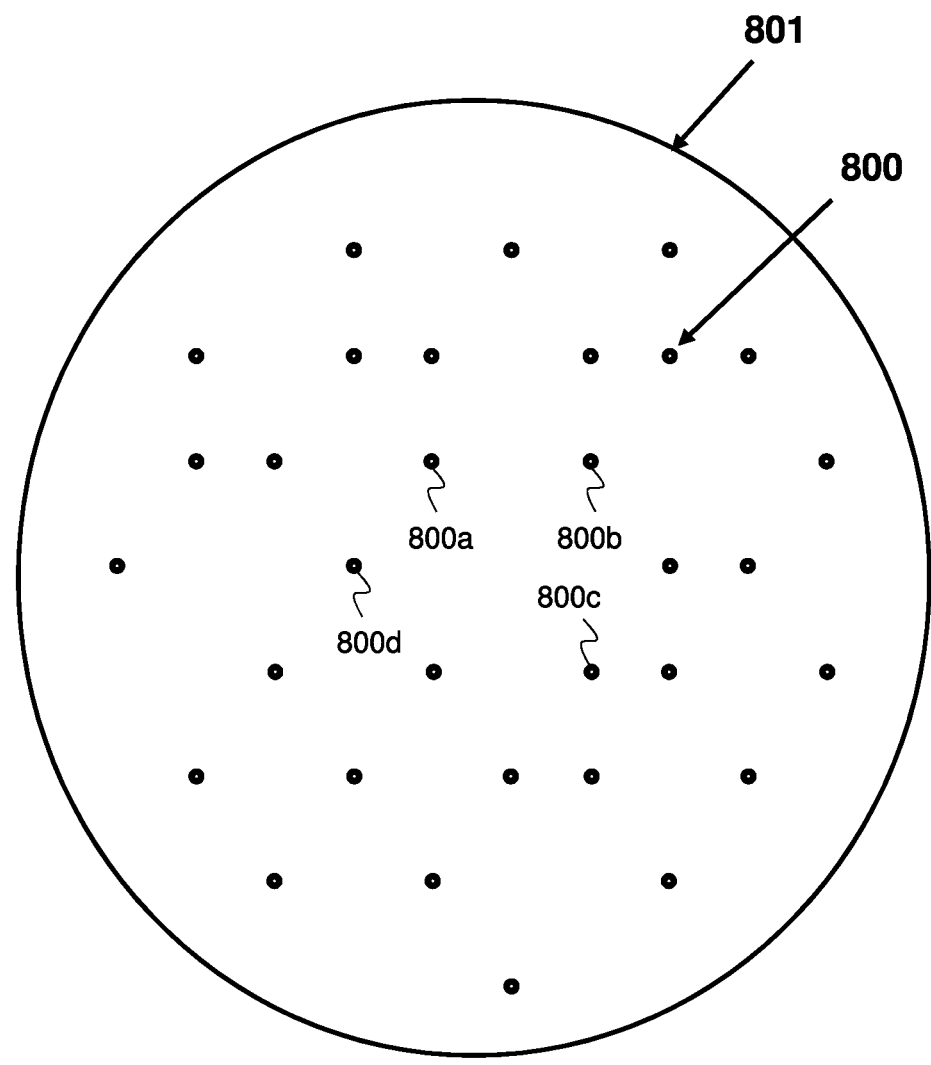
FIG. 8A is a sparse layout according to an embodiment.

As discussed earlier, the first and second measurement data 602 include, but not limited to, X-Y positions of the marks of the sparse and dense layout respectively, height (Z) at the marks, deviations before and after exposure, overlay, etc. FIG. 8A illustrates and example sparse layout 800 of a substrate 801, where the sparse layout 800 includes 32 marks. The sparse layout 800 includes marks (e.g., 800a, 800b, 800c, 800d, etc.) that are spaced relatively far from each other. In an embodiment, the number of marks of the sparse layout 800 are limited by throughput requirement of, e.g., lithographic apparatus. Typically, lithographic apparatuses used in a patterning process are very expensive, and to make the patterning process profitable sufficient number of wafers per hour should be exposed. For example, recent machines can expose more than 275 wafers per hour). This means, in practice, measurement time available is a few seconds per wafer. Hence, it may be possible to measure only a limited number of marks (approximately 44 to 65 marks). In other words, the sparse layout may include approximately 1 mark per field of the wafer. In an embodiment, the sparse layout 800 may include less than 100 marks (e.g., 40, 44, 65 marks, etc.). Typically, data falls in over-fitting region (e.g., more and sufficiently distributed measurements than number of model parameters). However, the number of marks in the sparse layout is not sufficient to reach high noise suppression and cross-talks are present between model components. To overcome such issue, the present disclosure determines the second fitted model 610 (associated with the sparse layout) in cooperation with the first fitted model 604.

Figure 8B:
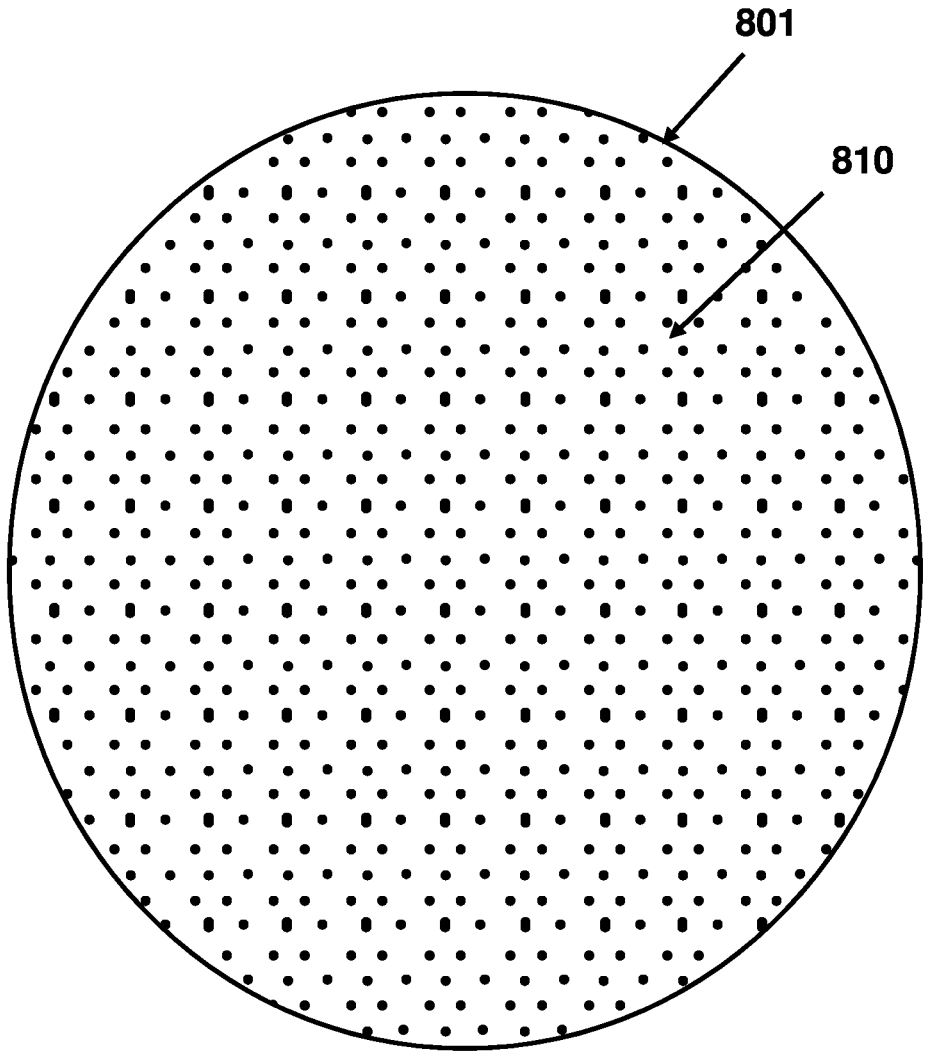
FIG. 8B is a dense overlay layout according to an embodiment.

The first fitted model 604 being fitted based on the second measurement data obtained from relatively dense layout 603 (or 605), and thereby more accurately describes e.g., a substrate deformation. In an embodiment, the first fitted model 604 is a model fitted based on historical data associated with a relatively dense alignment mark layout 603 or dense overlay mark layout 605. An example of a dense mark layout is shown in FIG. 8B, where the dense mark layout 810 includes 1024 marks.

In an embodiment, the first fitted model 604 and the second fitted model can be any mathematical model comprising a plurality of parameters that can be fitted according to present disclosure. For example, the second fitted model (and/or the first fitted model 604) can be a four-parameter (4PAR) model, a six-parameters (6PAR) model, or a combination of two or more models, which can be referred as a single model (e.g., a substrate model, as discussed earlier). For example, the second fitted model (and/or the first model 604) can be a combination of two sub-models: one sub-model has a first set of parameters (e.g., four-parameters) and another sub-model has a second set of parameters (e.g., six parameters). According to the present disclosure, the second fitted model has the values of models parameters determined via model fitting based on historical data (e.g., overlay or alignment data) in cooperation with an oblique projection data (e.g., oblique projection matrix or oblique projection operator), as discussed below. In an embodiment, the oblique projection data is represented in form a matrix that is further used with the alignment model (e.g., represented in matrix form) to fit the alignment model. The oblique projection approach for model fitting provides a more accurate fitted model compared to existing model fitting approaches.

Procedure P603 involves determining the alignment model 610 based on a second fitted model describes object deformation for the relatively sparse mark layout (e.g., 800), via an oblique fitting technique. In an embodiment, the oblique fitting technique may be based on the first and second measurement data 602, the first fitted model 604, and a generalized least squares fitting employing an oblique inner product matrix, as discussed earlier and further discussed with respect to a procedure P615 in FIG. 7. In other embodiment, the oblique fitting technique may be based on an oblique projection least squares fitting employing an oblique projection matrix, discussed earlier and also further discussed with respect to a procedure P715 in FIG. 7.

In an embodiment, the object is a wafer of a patterning process, and the alignment model is a wafer alignment model. The object deformation is deformation of a surface of the wafer on which a desired pattern is transferred via the patterning process.

Figure 7:
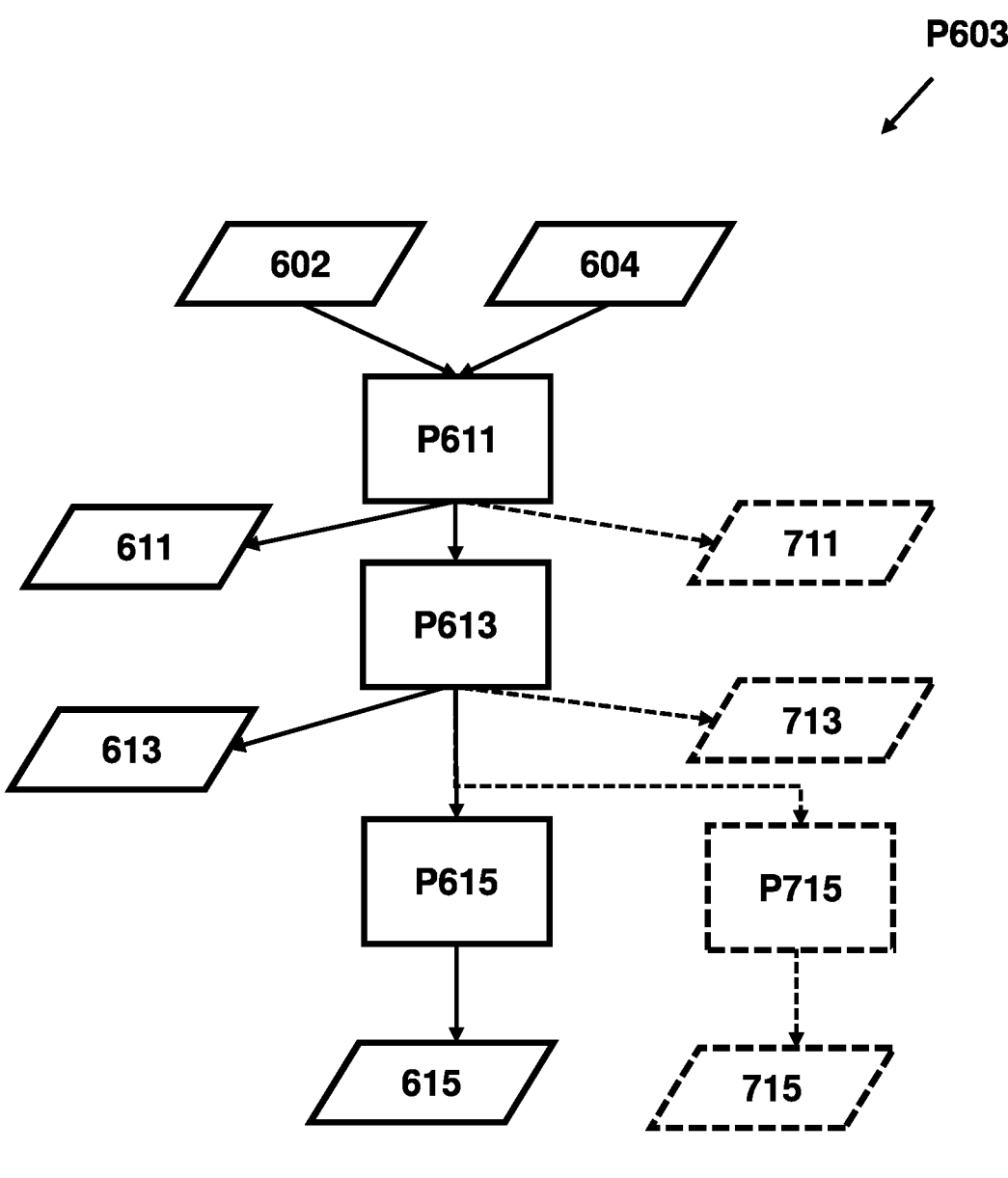
FIG. 7 is an example method of a second alignment model employed in FIG. 6 according to an embodiment.

An example flow chart of the procedure P603 is further discussed with respect to FIG. 7. In an embodiment, the determination of the oblique inner product matrix or the determination of the oblique projection matrix may be an iterative process, wherein an iteration comprises Procedures P611, P613 and P615. In an embodiment, the coefficients are adjusted in each iteration such that a difference is reduced or minimized, further discussed below. In an embodiment, once the difference is minimized the second fitted model is considered as the alignment model that can be employed in lithographic applications.

Procedure P611 involves determining a first output 611 (e.g., correctable values ye determined using the first fitted model 604, discussed earlier) using the first fitted model 604 and the first measurement data. Procedure P613 involves determining a second output 613 (e.g., $x_c(W)$) using the oblique inner product matrix W, the second fitted model (e.g., represented by matrix $M_x$), the second measurement data x, and the first fitted model 604 (e.g., represented by matrix $M_y$).

In an embodiment, procedure P615 involves determining coefficients 615 of the oblique inner product matrix (e.g., W) such that a difference between the first output and the second output is reduced. In an embodiment, the iteration continues till the difference is minimized.

In an embodiment, the first and second measurement data comprise alignment mark measurement position data and/or overlay measurement position data and the determining coefficients 615 of the oblique inner product matrix W involves executing a mathematical model below:

$$c_w = \left(M_x^T W^T W M_x\right)^{-1} M_x^T W^T W x$$

$$x_c = M_y c_w$$

$$y_c = M_y \left(M_y^T M_y\right)^{-1} M_y^T y$$

$$W = \underset{W}{\operatorname{argmin}} \|y_c - x_c(W)\|$$

Where, (a) W is the oblique inner product matrix; (b) $c_w$ are fit coefficients of W associated with the second fitted model; (c) $M_x$ comprises model functions of the second fitted model associated with the sparse mark layout; (d) $M_y$ comprises model functions of the first fitted model 604 associated with the dense mark layout; (e) $x_c$ is the second output 613 evaluated on the dense mark layout based on $M_y$ associated with the first fitted model 604, the second measurement data x, and the coefficients of W associated with the second fitted model; and (f) $y_c$ is the first output 611 based on the first fitted model 604 and the first measurement data y.

In an embodiment, in a first iteration of the determination of the oblique inner product matrix, initial values of the coefficients of the oblique inner product matrix may be selected randomly (e.g., from a Gaussian distribution) or user-selected to generate a second output. In subsequent iterations, current values of the coefficients of the oblique inner product matrix are modified so that the first output and the second output is reduced.

In an embodiment, the above difference between the first output 611 and the second output 613 is minimized. In an embodiment, the second measurement data includes position data and displacement data of the sparse alignment mark layout with respect to predetermined nominal position data. The second measurement data may be alignment data or overlay data measure via alignment sensors as discussed earlier. Same situation is applicable with the first measurement data. Therefore, the data described in the sparse or dense mark layout may comprise alignment mark measurement position data or overlay measurement position data.

As mentioned earlier, the sparse mark layout (e.g., 800) comprises substantially less number of marks than the dense mark layout. For example, the sparse layout comprises less than or equal to 65 marks.

In an embodiment, the oblique fitting technique may be based on an oblique projection least squares fitting employing an oblique projection matrix. Then, the procedure P715 may be used to determine the coefficients of oblique projection matrix.

For example, the procedure P715 involves determining coefficients 715 of the oblique projection matrix such that a difference between a first output 711 and a second output 713 is reduced.

In an embodiment, the determining coefficients of the oblique projection matrix involves executing a mathematical model below, where x is the second measurement data (based on alignment mark layout or overlay layout).

$$c_p = \left(M_x^T M_x\right)^{-1} M_x^T P x$$

$$P = \underset{\substack{\text{argmin} \\ P \text{ being a oblique projection matrix}}}{} \|y_c - M_y c_p\|$$

In the above equations: (a) P is the oblique projection matrix; (b) c, are fit coefficients of the oblique projection matrix P associated with the second fitted model; (c) $M_x$ includes model functions associated with the sparse mark layout; (d) x is the second measurement data; (e) $M_y$ comprises model functions of the first fitted model 604 associated with the dense mark layout; (f) $y_c$ is the first output 711 described by the first fitted model 604 and the measurement data; and (g) $M_y c_p$ refers to the second output 711 computed based on $M_x$ associated with the second fitted model 610, the second measurement data x, and $M_y$ associated with the first fitted model 604 and evaluated on the first measurement data. Particularly, $c_p$ is determined using $M_x$ of the second fitted model, the second measurement data x, as described in the equation above.

In an embodiment, the above difference between the first output 711 and the second output 713 is minimized. In an embodiment, the second measurement data includes position data and displacement data of the sparse alignment mark layout with respect to predetermined nominal position data. The second measurement data may be alignment data or overlay data measure via alignment sensors as discussed earlier. Same situation is applicable with the first measurement data.

As mentioned earlier, the sparse mark layout (e.g., 800) comprises substantially less number of marks than the dense mark layout. For example, the sparse layout comprises less than or equal to 65 marks.

Furthermore, in an embodiment, as mentioned earlier, the alignment model may be determined using dense overlay data, i.e., overlay measurement position data. Accordingly, there is provided another method (e.g., similar to methods 600) of determining a fitted model associated with an alignment mark layout. The method involves obtaining measurement data (e.g., 602) associated with a relatively sparse alignment mark layout in comparison with a relatively dense overlay mark layout 605, and a first alignment model 604 that describes object deformation for the relatively dense overlay mark layout.

Further, the method involves determining the alignment model based on a second fitted model that describes object deformation for the relatively sparse alignment mark layout, via oblique fitting technique. The fitting technique is a generalized least squares fitting employing an oblique inner product matrix or is an oblique projection least squares fitting employing an oblique projection matrix, as discussed above.

After the model fitting process, the oblique projection data (e.g., represented as oblique projection matrix) when used with the fitted model (e.g., model matrix) can suppress noise and crosstalk components (e.g., between correctable and non-correctable) associated with the fitted model for a sparse layout. For example, the components of the alignment model include a correctable component (e.g., substrate or process corrections determined via the alignment model) and a non-correctable component (e.g., residuals of the alignment model). Residuals are a difference in observed data and model predictions.

Figure 9A:
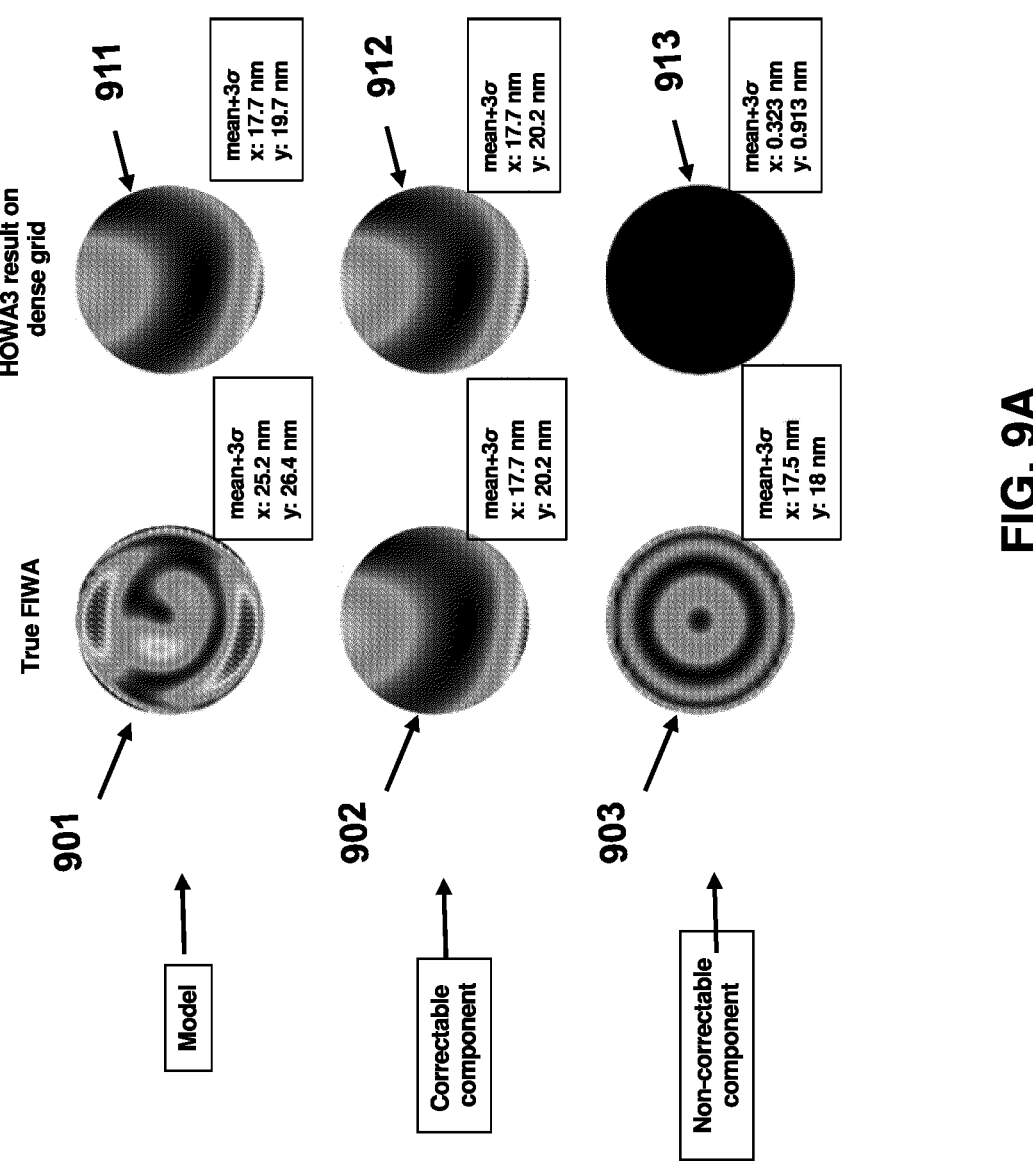
FIG. 9A and FIG. 9B are results of different alignment models fitted using dense layout and sparse layout respectively according to an embodiment.
Figure 9B:
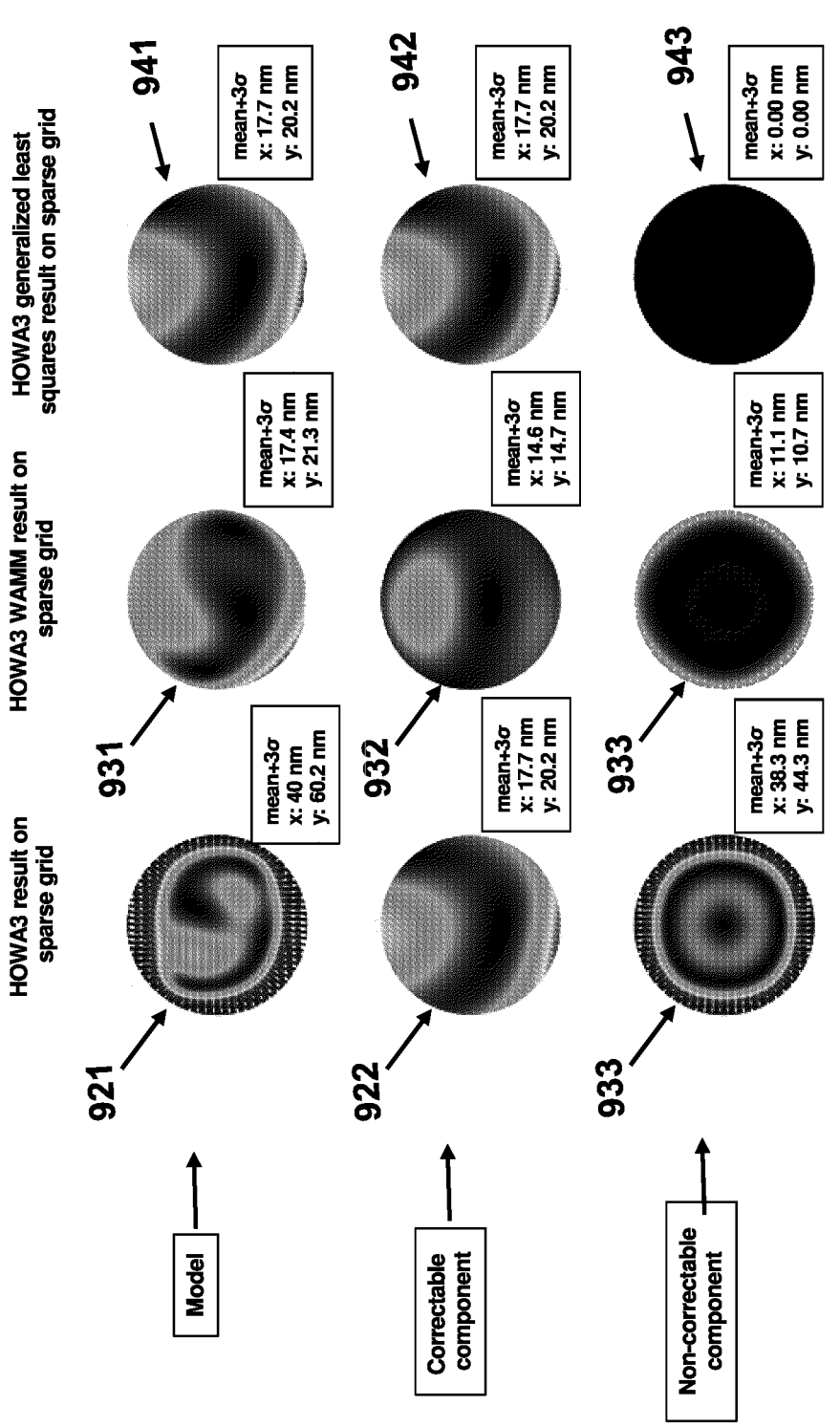

The residuals are negligible to zero when the model describes the data (e.g., historical alignment or overlay data used for model fitting) accurately (e.g., residuals 913 and 943 in FIGS. 9A and 9B, respectively). A negligible or zero residual is highly desired since it indicates that the model makes accurate predictions (e.g., of substrate deformations) associated with a substrate, thereby corrections for entire substrate may be determined. However, if residuals exists e.g., associated with an edge of the substrate, it indicates that the model predictions may not be accurate, as such corrections (e.g., substrate table adjustment, focus adjustments of lithographic apparatus, etc.) may not be determined at the edge of the substrate. FIGS. 9A and 9B illustrate examples of correctable components and residuals for different alignment models.

FIGS. 9A and 9B illustrate example results of different models fitted using measurement data from a dense layout and a sparse layout. In FIG. 9A, results of executing an alignment model associated with a fine wafer grid. In an embodiment, a model output 901 represents the substrate deformation (or shape) that is decomposed into a correctable component 902 (or shape) and non-correctable component 903 (or shape). The model has substantial residual values in 903.

In an embodiment, a higher order wafer model results on dense layout data are illustrated. For example, a model output 911 represents the substrate deformation (or shape)

that is decomposed into a correctable component 912 (or shape) and non-correctable component 913 (or shape). Note that, higher order model and dense measurement data provides a fit where the residuals are negligible. For example, in the shown example, the mean residual values in x and y are 0.323 nm and 0.313 nm respectively.

Referring to FIG. 9B, the higher order wafer model fitted using existing methods and sparse layout data provides results as illustrated. For example, a model output 921 represents the substrate deformation (or shape) that is decomposed into a correctable component 922 (or shape) and non-correctable component 923 (or shape). Note that due to use of the sparse layout data, the residuals are substantial. For example, as shown in 933, the residuals along the edges is substantially higher compared to the center portion of the substrate. Thus, the higher order wafer model fitted on sparse layout does not provide accurate predictions of substrate deformation.

In an embodiment, the higher order wafer model using WAMM method (discussed earlier) and sparse layout data provides results as illustrated. For example, a model output 931 represents the substrate deformation (or shape) that is decomposed into a correctable component 932 (or shape) and non-correctable component 933 (or shape). Note that due to use of the sparse layout data, the residuals are substantial at the edge, but negligible at the center. Thus, the higher order model fitted with existing method and WAMM based method results 921 and 931 are substantially different. Particularly, the WAMM based model's residuals 933 are substantially lower than residual 923, except for residual at the edge of the wafer.

The alignment model determined according to method discussed above (e.g., methods 600 and 700) provide much superior results 941 compared to results 911, 921, and 931 discussed above. For example, the alignment model even though fitted using the sparse data provides negligible to zero residuals 943 throughout the substrate. For example, compared to residuals 913, 923, and 933, the residuals 943 are negligible at the edge of the substrate. Thus, the alignment model determined according to methods 600 and 700 is advantageously more accurate.

According to an embodiment, the alignment model obtained according to any of the embodiments of the method of this invention can be further employed in controlling the lithographic apparatus LA, as discussed above in FIG. 5. For example, the alignment model is the substrate model SM which works in cooperation with the process model PM to control the lithographic apparatus in a patterning process.

According to an embodiment, the alignment model can be further employed in determining sampling for a metrology tool. As the alignment model can accurately determine substrate deformation, the results of executing the model provides deformation information which can be used to accurately determine a location on the wafer to be measured.

The term "value" can be numeric, symbolic, alphabetic, etc. data.

In an embodiment, the term "optimize", "optimizing" and "optimization" as used herein refers to or means adjusting a patterning apparatus (e.g., a lithography apparatus), a patterning process, etc. such that results and/or processes have more desirable characteristics, such as higher accuracy of projection of a design layout on a substrate, a larger process window, etc. Thus, the term "optimizing" and "optimization" as used herein refers to or means a process that identifies one or more values for one or more parameters that provide an improvement, e.g. a local optimum, in at least one relevant metric, compared to an initial set of one or more values for those one or more parameters. "Optimum" and other related terms should be construed accordingly. In an embodiment, optimization steps can be applied iteratively to provide further improvements in one or more metrics.

The concepts disclosed herein may simulate or mathematically model any generic imaging system for imaging sub wavelength features, and may be especially useful with emerging imaging technologies capable of producing increasingly shorter wavelengths. Emerging technologies already in use include EUV (extreme ultra violet), DUV lithography that is capable of producing a 193 nm wavelength with the use of an ArF laser, and even a 157 nm wavelength with the use of a Fluorine laser. Moreover, EUV lithography is capable of producing wavelengths within a range of 20-5 nm by using a synchrotron or by hitting a material (either solid or a plasma) with high energy electrons in order to produce photons within this range.

While the concepts disclosed herein may be used for imaging on a substrate such as a silicon wafer, it shall be understood that the disclosed concepts may be used with any type of lithographic imaging systems, e.g., those used for imaging on substrates other than silicon wafers.

Although specific reference may be made in this text to the use of a lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

Although specific reference may be made in this text to embodiments of the invention in the context of a lithographic apparatus, embodiments of the invention may be used in other apparatus. Embodiments of the invention may form part of a mask inspection apparatus, a metrology apparatus, or any apparatus that measures or processes an object such as a wafer (or other substrate) or mask (or other patterning device). These apparatus may be generally referred to as lithographic tools. Such a lithographic tool may use vacuum conditions or ambient (non-vacuum) conditions.

Although specific reference may have been made above to the use of embodiments of the invention in the context of optical lithography, it will be appreciated that the invention, where the context allows, is not limited to optical lithography and may be used in other applications, for example imprint lithography.

Where the context allows, embodiments of the invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic storage media; optical storage media; flash memory devices; electrical, optical, acoustical or other forms of propagated signals (e.g. carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc. and in doing that may cause actuators or other devices to interact with the physical world.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

The invention claimed is:

1. A method for generating an alignment model associated with a mark layout of alignment marks disposed on a wafer, the mark layout including a relatively sparse mark layout and a relatively dense mark layout, the alignment model used by a lithographic apparatus for correcting wafer distortions during a patterning process of the wafer, the method comprising:

obtaining first measurement data associated with the relatively dense mark layout in comparison with the relatively sparse mark layout and second measurement data associated with the relatively sparse mark layout, wherein the first and second measurement data comprise at least one of alignment mark measurement position data or overlay measurement position data;

modeling a first fitted model that describes deformation of the wafer for the relatively dense mark layout, wherein the wafer deformation includes deformation of a surface of the wafer on which a desired pattern is transferred via the patterning process;

modeling a second fitted model that describes the wafer deformation for the relatively sparse mark layout; and determining the alignment model, the determined alignment model being associated with the mark layout disposed on the wafer and based on cooperation between the first fitted model and the second fitted model via an oblique fitting technique, wherein the determining comprises:

determining a first output using the first fitted model and the first measurement data;

determining a second output using the oblique fitting technique, the second fitted model, the second measurement data, and the first fitted model; and adjusting coefficients of the oblique fitting technique such that a difference between the first output of the first fitted model and the second output of the second fitted model is reduced, so that the second fitted model with the adjusted coefficients is the alignment model.

2. The method according to claim 1, wherein the oblique fitting technique is a generalized least squares fitting employing an oblique inner product matrix.

3. The method of claim 2, wherein the adjusting coefficients of the oblique inner product matrix comprises:

executing a mathematical model below:

$$x_c = M_y c_w$$

$$c_w = \left(M_x^T W^T W M_x\right)^{-1} M_x^T W^T W x$$

$$y_c = M_y \left(M_y^T M_y\right)^{-1} M_y^T y$$

$$W = \underset{W}{\mathrm{argmin}} \|y_c - x_c(W)\|$$

wherein: W is the oblique inner product matrix; $c_w$ are fit coefficients of W associated with the second fitted model; $M_x$ comprises model functions of the second fitted model associated with the relatively sparse mark layout; $M_y$ comprises model functions of the first fitted model associated with the relatively dense mark layout; $x_c$ is the second output evaluated on the relatively dense mark layout based on $M_y$ associated with the first fitted model, the second measurement data x, and coefficients of W associated with the second fitted model; and $y_c$ is the first output based on the first fitted model and the first measurement data y.

4. The method according to claim 1, wherein the oblique fitting technique is an oblique projection least squares fitting employing an oblique projection matrix.

5. The method of claim 4, wherein the adjusting coefficients of the oblique projection matrix comprises:

executing a mathematical model below:

$$c_p = \left(M_x^T M_x\right)^{-1} M_x^T P x$$

$$P = \underset{P\ being\ a\ oblique\ projection\ matrix}{\mathrm{argmin}} \|y_c - M_y c_p\|$$

$$y_c = M_y \left(M_y^T M_y\right)^{-1} M_y^T y$$

wherein: P is the oblique projection matrix; $c_p$ are fit coefficients of the oblique projection matrix P associated with the second fitted model; $M_x$ comprises model functions associated with the relatively sparse mark layout; x is the second measurement data; $M_y$ comprises model functions of the first fitted model associated with the relatively dense mark layout; $y_c$ is the first output described by the first fitted model and evaluated on the first measurement data; and $M_y c_p$ refers to the second output computed based on $M_x$ associated with the second fitted model, the second measurement data x, and evaluated on the relatively dense mark layout using $M_y$ associated with the first fitted model.

6. The method of claim 4, wherein the oblique fitting technique is configured to employ an oblique projection matrix.

7. The method of claim 1, wherein the second measurement data further comprises displacement data of the sparse mark layout with respect to predetermined nominal position data.

8. The method of claim 1, wherein the first and second fitted models are wafer fitted model.

9. The method of claim 1, wherein the second fitted model and/or the first model are a combination of two sub-models: a first sub-model comprising a first set of parameters, preferably four-parameters, and second sub-model comprising a second set of parameters, preferably six parameters.

10. A computer program product comprising a non-transitory computer readable medium having instructions recorded thereon, the instructions when executed by a computer causes the computer to perform a method for generating an alignment model associated with a mark layout of alignment marks disposed on a wafer, the mark layout including a relatively sparse mark layout and a relatively dense mark layout, the alignment model used by a lithographic apparatus for correcting wafer distortions during a patterning process of the wafer, the method comprising:

obtaining first measurement data associated with the relatively dense mark layout in comparison with the relatively sparse mark layout and second measurement data associated with the relatively sparse mark layout, wherein the first and second measurement data comprise at least one of alignment mark measurement position data or overlay measurement position data;

modeling a first fitted model that describes deformation of the wafer for the relatively dense mark layout, wherein the wafer deformation includes deformation of a surface of the wafer on which a desired pattern is transferred via the patterning process;

modeling a second fitted model that describes the wafer deformation for the relatively sparse mark layout; and determining the alignment model, the determined alignment model being associated with the mark layout disposed on the wafer and based on cooperation between the first fitted model and the second fitted model via an oblique fitting technique, wherein the determining comprises:

determining a first output using the first fitted model and the first measurement data;

determining a second output using the oblique fitting technique, the second fitted model, the second measurement data, and the first fitted model; and adjusting coefficients of the oblique fitting technique such that a difference between the first output of the first fitted model and the second output of the second fitted model is reduced, so that the second fitted model with the adjusted coefficients is the alignment model.

11. A measurement system comprising a computer program product comprising a non-transitory computer readable medium having instructions recorded thereon, the instructions when executed by a computer cause the computer to perform a method for generating an alignment model associated with a mark layout of alignment marks disposed on a wafer, the mark layout including a relatively sparse mark layout and a relatively dense mark layout, the alignment model used by a lithographic apparatus for correcting wafer distortions during a patterning process of the wafer, the method comprising:

obtaining first measurement data associated with the relatively dense mark layout in comparison with the relatively sparse mark layout and second measurement data associated with the relatively sparse mark layout, wherein the first and second measurement data comprise at least one of alignment mark measurement position data or overlay measurement position data;

modeling a first fitted model that describes deformation of the wafer for the relatively dense mark layout, wherein the wafer deformation includes deformation of a surface of the wafer on which a desired pattern is transferred via the patterning process;

modeling a second fitted model that describes the wafer deformation for the relatively sparse mark layout; and determining the alignment model, the determined alignment model being associated with the mark layout disposed on the wafer and based on cooperation between the first fitted model and the second fitted model via an oblique fitting technique, wherein the determining comprises:

determining a first output using the first fitted model and the first measurement data;

determining a second output using the oblique fitting technique, the second fitted model, the second measurement data, and the first fitted model; and adjusting coefficients of the oblique fitting technique such that a difference between the first output of the first fitted model and the second output of the second fitted model is reduced, so that the second fitted model with the adjusted coefficients is the alignment model.

12. A lithography apparatus comprising a measurement system comprising a computer program product comprising a non-transitory computer readable medium having instructions recorded thereon, the instructions when executed by a computer cause the computer to perform a method for generating an alignment model associated with a mark layout of alignment marks disposed on a wafer, the mark layout including a relatively sparse mark layout and a relatively dense mark layout, the alignment model used by a lithographic apparatus for correcting wafer distortions during a patterning process of the wafer, the method comprising:

obtaining first measurement data associated with the relatively dense mark layout in comparison with the relatively sparse mark layout and second measurement data associated with the relatively sparse mark layout, wherein the first and second measurement data comprises at least one of alignment mark measurement position data and/or overlay measurement position data;

modeling a first fitted model that describes deformation of the wafer for the relatively dense mark layout, wherein the wafer deformation includes deformation of a surface of the wafer on which a desired pattern is transferred via the patterning process;

modeling a second fitted model that describes the wafer deformation for the relatively sparse mark layout; and determining the alignment model, the determined alignment model being associated with the mark layout disposed on the wafer and based on cooperation between the first fitted model and the second fitted model via an oblique fitting technique, wherein the determining comprises:

determining a first output using the first fitted model and the first measurement data;

determining a second output using the oblique fitting technique, the second fitted model, the second measurement data, and the first fitted model; and adjusting coefficients of the oblique fitting technique such that a difference between the first output of the first fitted model and the second output of the second fitted model is reduced, so that the second fitted model with the adjusted coefficients is the alignment model.

* * * * *